(12) United States Patent
Staszewski et al.

(10) Patent No.: US 7,834,686 B2
(45) Date of Patent: Nov. 16, 2010

(54) POWER AMPLIFIER

(75) Inventors: Robert Bogdan Staszewski, Garland, TX (US); See Taur Lee, Allen, TX (US); Dirk Leipold, Igis (CH)

(73) Assignee: Texas Instruments Incorporated, Dallas, TX (US)

( * ) Notice: Subject to any disclaimer, the term of this patent is extended or adjusted under 35 U.S.C. 154(b) by 233 days.

(21) Appl. No.: 12/134,464

(22) Filed: Jun. 6, 2008

(65) Prior Publication Data
US 2009/0096525 A1    Apr. 16, 2009

Related U.S. Application Data

(60) Provisional application No. 60/945,643, filed on Jun. 22, 2007.

(51) Int. Cl.
*H03F 1/14* (2006.01)

(52) U.S. Cl. .................... 330/51; 330/124 R; 330/195; 330/295

(58) Field of Classification Search .................. 330/51, 330/124 R, 195, 295
See application file for complete search history.

(56) References Cited

U.S. PATENT DOCUMENTS

| 4,868,445 | A * | 9/1989 | Wand | 310/316.01 |
|---|---|---|---|---|
| 6,639,462 | B1 * | 10/2003 | Luu | 330/51 |
| 7,071,784 | B2 * | 7/2006 | Seremeta | 330/311 |
| 7,084,677 | B2 * | 8/2006 | Ferianz et al. | 327/108 |
| 7,245,189 | B2 * | 7/2007 | Seremeta | 330/311 |
| 7,365,605 | B1 * | 4/2008 | Hoover | 330/301 |

* cited by examiner

*Primary Examiner*—Patricia Nguyen
(74) *Attorney, Agent, or Firm*—Ronald O. Neerings; Wade James Brady, III; Frederick J. Telecky, Jr.

(57) ABSTRACT

Methods to implement power control in a digital power amplifier are described.

23 Claims, 17 Drawing Sheets

POWER AMPLIFIER

RELATED APPLICATIONS

The present application claims priority under 35 U.S.C. §119(e) to U.S. Provisional Application No. 60/945,643 filed Jun. 22, 2007, the disclosure of which is incorporated herein.

BACKGROUND

RF power amplifiers are used in applications such as wireless cellular handsets. Wireless cellular devices may implement technologies that typically need particular power consumption requirements. In certain applications, power amplifiers implement or utilize analog signals, and specifically analog input signals that resemble sinusoidal waveforms, and typically use active devices as voltage-controlled current sources. Such power amplifiers and may be termed analog power amplifiers and typically belong to operational classes A, AB, B and C as known in the industry. Power amplifiers that implement digital signals or utilize digital or square input signals that resemble clock waveforms are termed digital power amplifiers and typically belong to operational classes D, E and F as known in the industry. Such power amplifiers typically use active devices as resistive switches. For analog power amplifiers, the main transistor acts as a rather linear element, whereas in for digital power amplifiers, the main transistor acts as a rather switch. Both analog and digital power amplifiers present common and unique issues. Common design issues include modulation fidelity, power switching, power control, and leakage as well as thermal gradients.

In certain design considerations, it is desirable to implement a digital power amplifier, also termed as power stage or RF digital to analog converter or DAC, instead of an analog power amplifier, such as when digital control is desired (i.e., having a digital clock signal); however, in applications such when lowering sensitivity for antenna reflections, typical implementation may be with an analog power amplifier that does not provide for a digital signal. Other design consideration may include proper power shutdown of arrays of power amplifiers. It is also desirable to have a high output power and highly efficient power amplifier.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In an embodiment, a system includes an array of digitally controlled power amplifiers that provides outputs to a combination transformer. Delay cells are placed before the power amplifiers to control the outputs.

BRIEF DESCRIPTION OF THE CONTENTS

DETAILED DESCRIPTION

An exemplary digital power amplifier with digital power and RF amplitude control is described. The digital power amplifier may be implemented in an array of amplifiers, as described in patent application Ser. No. 11/860,392, titled Integrated Power Amplifier, filed on Sep. 24, 2007, and incorporated by reference herein. Furthermore, the digital power amplifier may be include a power combiner, as described in patent application Ser. No. 11/860,265, titled Narrow Band Power Combiner and Methods To Implement CMOS RF Power Amplifier, filed on Sep. 24, 2007, and incorporated by reference herein.

The power amplifier may be radio frequency (RF) CMOS power amplifier using nanometer-scale CMOS technologies. The power amplifier may be included as part of a wireless communication device, such as a cellular telephone. An exemplary implementation includes a low cost, high efficiency and low loss narrow-band (i.e., fraction of the carrier RF frequency) power combiner using substrate traces printed on a chip package. An embodiment includes a low cost and power efficient power combiner printed on a package substrate and methods on how to connect the micro power amplifier and the power combiner to form a final integrated high power and high efficient nanoscale CMOS RF power amplifier. Furthermore, exemplary methods are discussed as to electrically connecting a power combiner and micro power amplifiers.

An RF power amplifier may be implemented using a low voltage nanoscale CMOS transistor having low breakdown voltage. Due to the ultra fast and highly efficient low voltage CMOS transistor available from the nanoscale technology, a final high output power and highly efficient RF power amplifier may be realized using low cost CMOS technology.

An exemplary method includes implementing a low cost, high efficiency and low loss transformer-based power combiner with series resonant capacitor to resonate out the leakage inductance. Nanoscale technology (e.g., 65 nm, 45 nm, 32 nm and beyond) may be used for integrated circuit or IC (e.g., wireless IC) designs where multiple functions and/or applications are integrated to reduce final fabrication cost. In certain cases, and in particular for CMOS technology, scaling may be performed from circuit technology nodes (i.e., node to node) in order to pack more transistors into a limited space. Due to such transistor scaling, the power supply may have to be scaled as well. For example, a maximum nominally sustainable power supply may be 1.2V for a 65 nm node, and 1.1V for a 45 nm node.

Figure 1A:
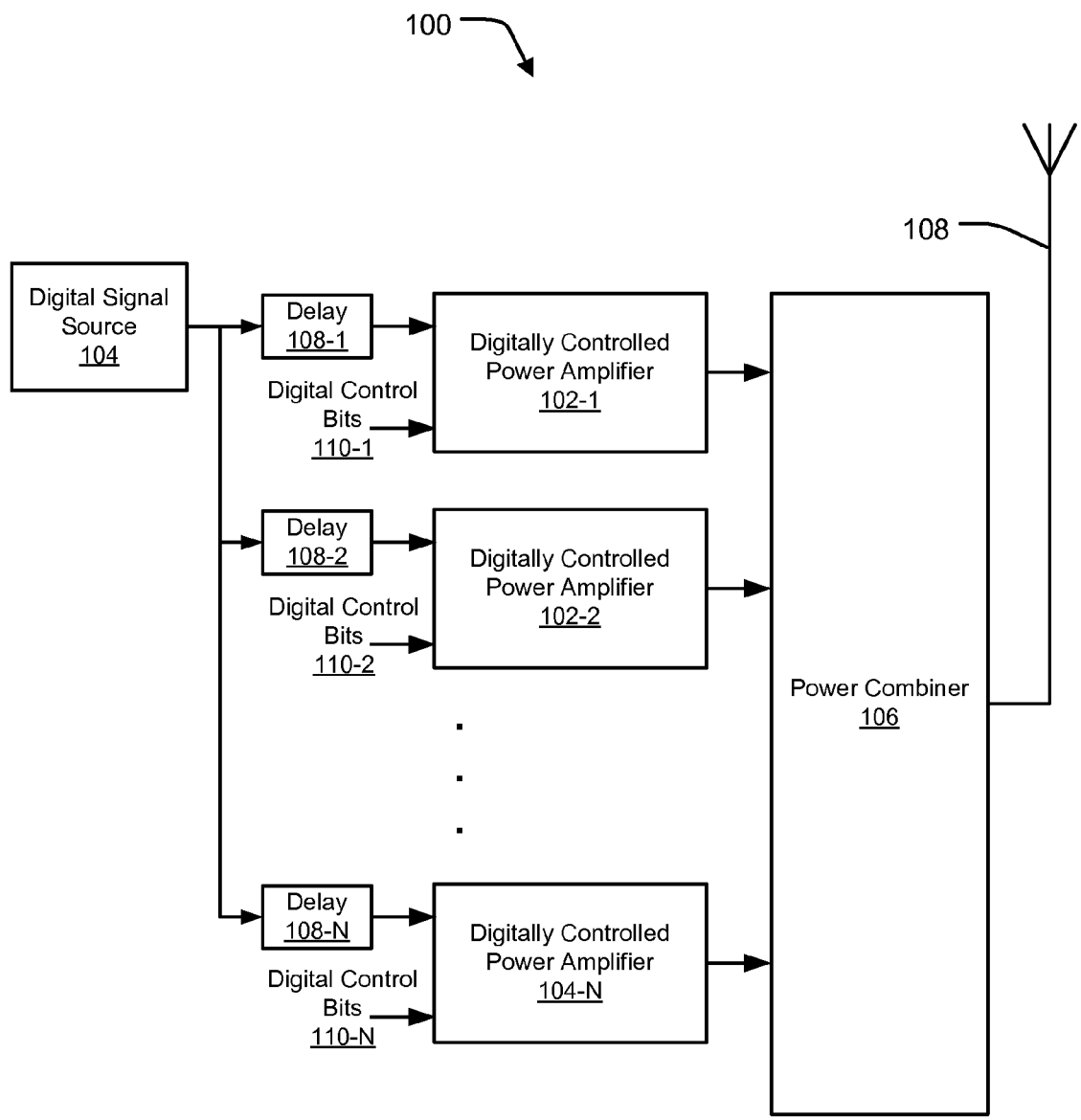
FIG. 1A illustrates a system of parallel array of digital power amplifiers followed by a power combiner.

FIG. 1A shows a system 100 of an array of parallel digitally controlled power amplifiers 102. Each of the power amplifiers 102 provides a power output, which are then all summed together. A digital control source 104 provides a digital signal such as a clock signal. The outputs of the digital controlled power amplifiers may be sent to a power combiner or parallel combination transformation component 106, such as a distributed transformer. In this implementation, delay cells/circuits or adjustable clock delays 108 are placed before each of the digital controlled power amplifiers 102. Digital control bits 110 may also be implemented for power amplifiers 102. For particular integrated circuit (IC) configurations, the power amplifiers 102 may be located in different areas. Therefore, a delay for each particular power amplifier 102 may be introduced for compensation. Furthermore, the delays 108 may be used to squelch a clock and effectively shut down power amplifier(s) 102. Shutting down the power amplifiers 102 may reduce RF leakage. The clock may also be negated such that the power contribution of that stage may be negative or subtracted from the stronger power delivered by the other stages.

Figure 1B:
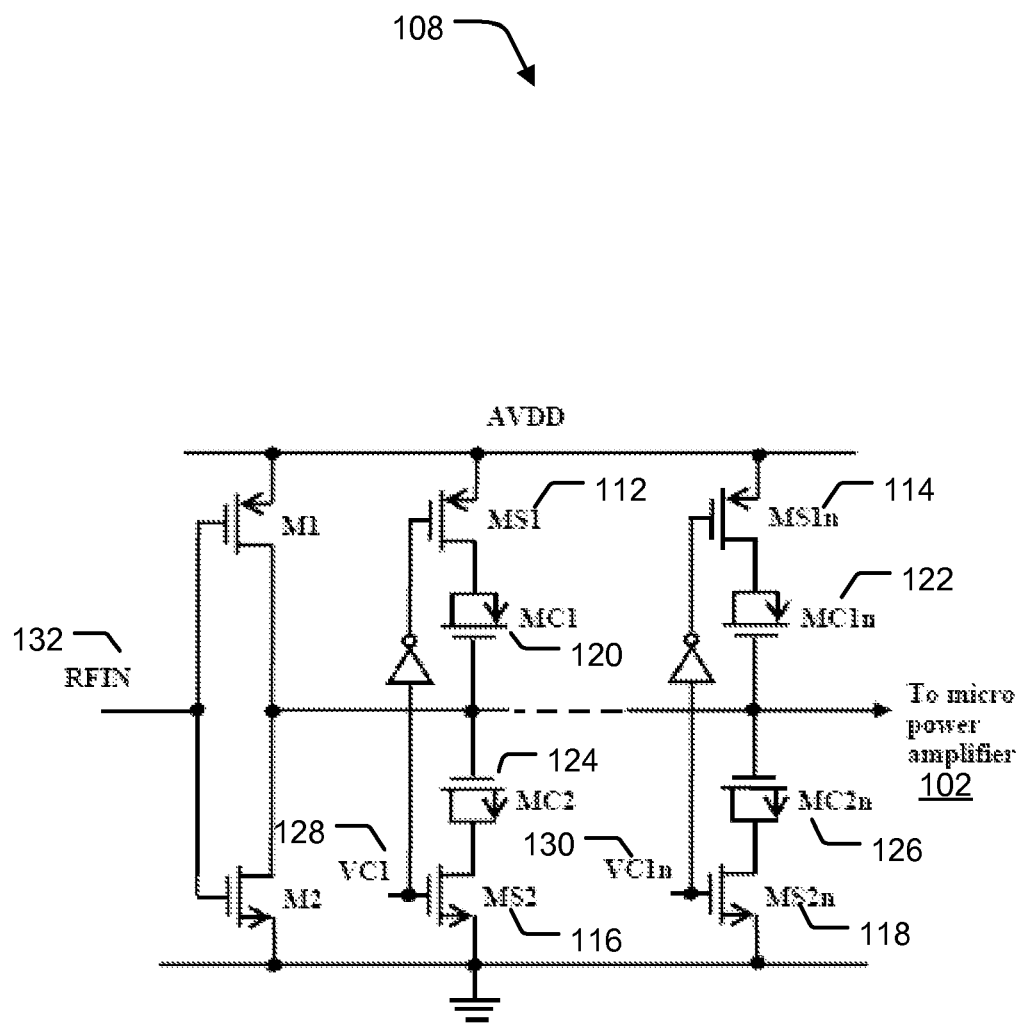
FIG. 1B illustrates an example delay cell.

FIG. 1B shows an exemplary implementation of a delay cell 108. For example, if a power amplifier 102 is operated as a switch amplifier where the input is driven by a voltage that goes from rail to rail, the delay cell 108 may be implemented as shown in FIG. 1B. In this example, transistors MS1 112 to MS1$n$ 114 and MS2 116 to MS2$n$ 118 act as switches and transistors MC1 120 to MC1$n$ 122 and MC2 124 to MC2$n$ 126 act as "capacitors." By turning on and off those "capacitors" through VC1 128 to VC1$n$ 130, the delay from RFIN 132 to the power amplifier 102 may be adjusted digitally. It is noted that a single-ended design is illustrated in this example; however it is to be appreciated that the design may be easily modified to accommodate differential inputs. Furthermore, another implementation may be used is to adjust the power supply of the driver to adjust the delay.

Figure 2:
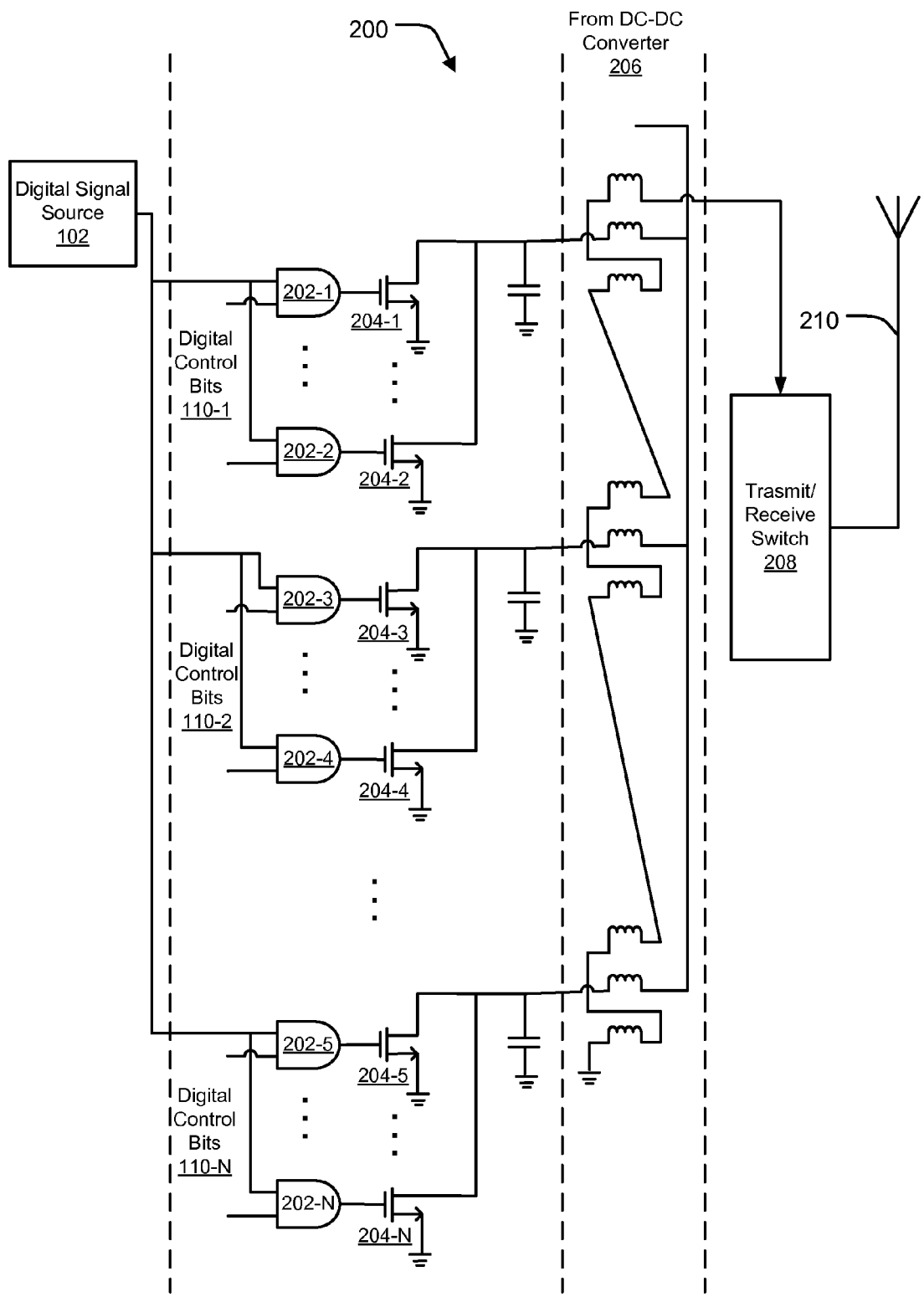
FIG. 2 illustrates an implementation of a parallel array of power amplifiers.

FIG. 2 shows an implementation of the parallel digitally controlled power amplifiers. The system 200 includes a series of connected gates 202 and number of MOS switches 204, each one providing certain conductance or current sinking capability (depending on the operational mode and transient voltage levels). MOS switches 204 are included in each digitally controlled power amplifier 202. Instead of a direct connection to a battery, a DC-DC Converter 206 may be provided in certain cases; along with a transmit/receive switch 208. An RF output 210 is transmitted. For simplicity, the delay cells are not shown in this figure.

Figure 3:
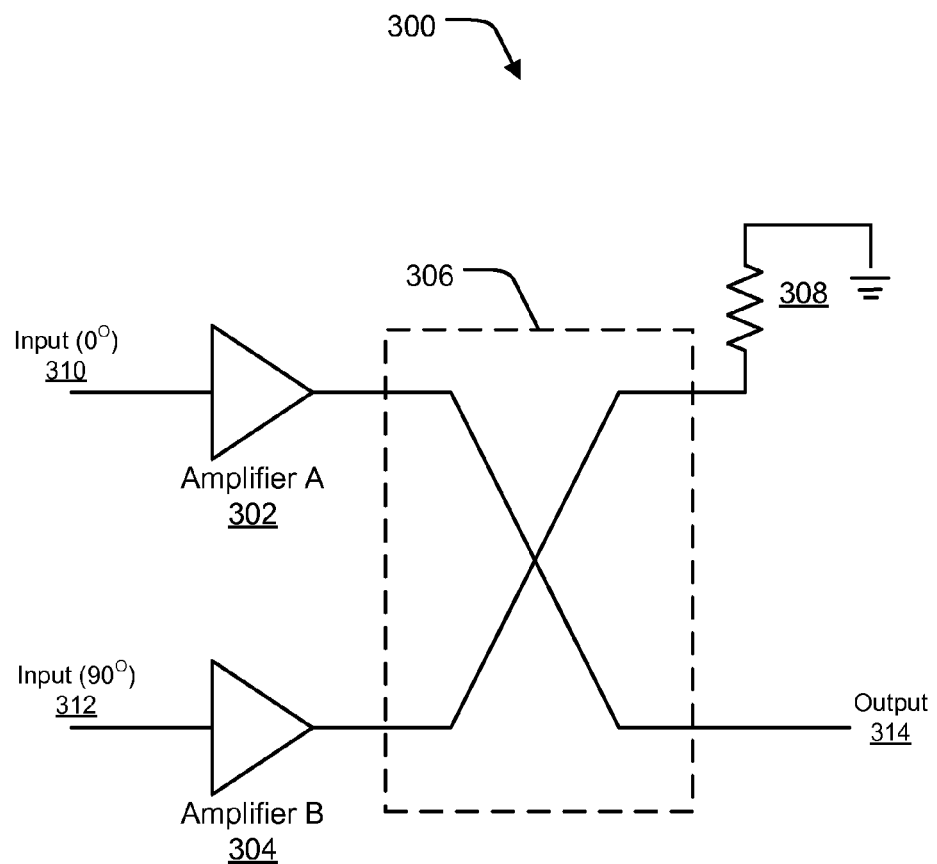
FIG. 3 illustrates a balanced power amplifier.

FIG. 3 shows an embodiment of a fully integrated balanced power amplifier 300 with digital clock carrier inputs. Amplifier 300 includes two amplifiers, amplifier A 302 and Amplifier B 304. In typical applications, it may be desirable to reduce load variation seen by the outputs of the power amplifier, and a hybrid coupler 306 may be implemented. Amplifier A 302 receives a 0 degree phase shift input 310, and Amplifier B receives a 90 degree phase shift (i.e., a quarter of the period delayed) input 312, where digital signals are initially phased shifted initially. Typically, when digital signals are not initially phase shifted, two couplers may be needed; however, in this example, only one coupler 306 is implemented along with a resistor 308. Coupler 306 may be a 3 decibel hybrid coupler, and resistor 308 may have a value of 50 ohms. Due to the 90° phase shift from the 3-dB coupler, the input to the balanced amplifier is compensated with similar phase shift as shown in FIG. 3. For GSM application for example, the phase modulated information to the power amplifier 300 may be easily phase shifted in the integrated circuit.

Figure 4:
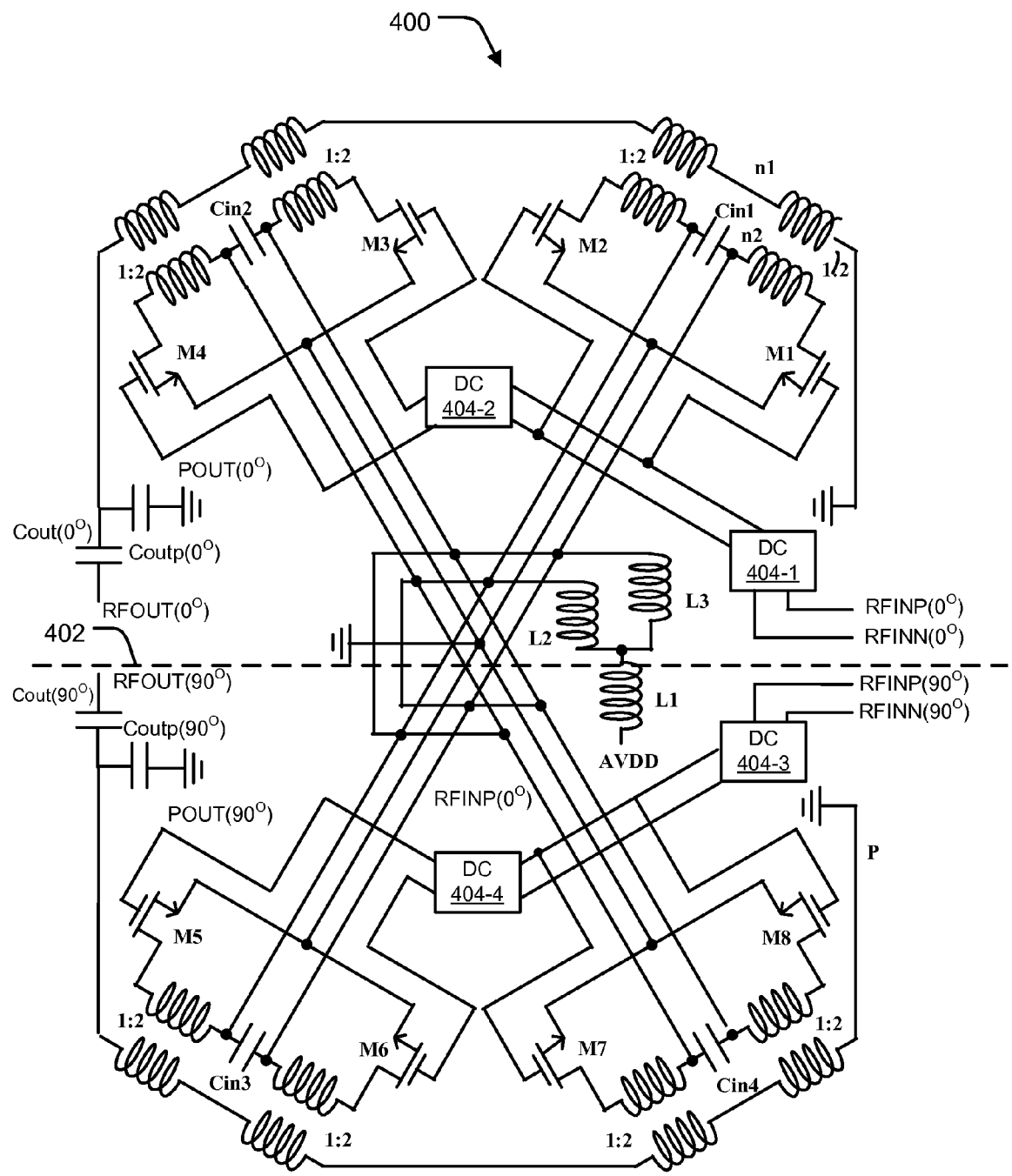
FIG. 4 illustrates an implementation of a balanced power amplifier as a μ (micro) power amplifier and narrow band power combiner.

FIG. 4 shows an exemplary schematic of a power amplifier 400 of the balanced power amplifier shown in FIG. 3. Amplifier A 302 may be realized by the schematic above dotted line 402, and Amplifier B 304 may be implemented by the schematic below dotted line 402. FIG. 4 is implemented as an array of μ (micro) power amplifiers (μPA) with a narrow band power combiner. Furthermore, power amplifier 400 includes cascaded delay circuits or cells 404 as generally described above in reference to FIGS. 1 and 2.

The narrow band power combiner is realized using four differential or eight single-ended (or generally M depending on the requirements) 1:2 or 1:N transformers with Cin1, Cin2, Cin3, Cin4, Cout and Coutp capacitors. One of the primary inputs is connected to the μPA and the other input is connected to a series tuning capacitor and also to the dc supply (AVDD) through inductors L1, L2 and L3. Two four secondaries are connected in series with one end connected to ground and the other end connected to output POUT (POUT(0°) and POUT (90°)). Capacitors Cin1, Cin2, Cin3 and Cin4 are placed in the network in such a way to resonate out the leakage inductances in series on the primary sides. On the secondary side, capacitor Cout (Cout(0°) and Cout(90°)) are used to resonate out total series leakage inductances from the secondary windings of the transformers. Capacitor Coutp (Coutp(0°) and Coutp (90°)) is added to provide another degree of freedom to tune the network 400. Series capacitors Cin1, Cin2, Cin3 and Cin4 which are on the primaries, and Cout which is on the secondary, are used to resonate out the series leakage inductances of the windings. The advantages of doing so are as follow. First, in order to achieve low loss, low cost, and area efficient transformer based power combiner, high coupling factor between the primary and the secondary is relatively difficult to attain. This leads to high leakage inductance and subsequently high loss on the power combiner.

A series capacitor is introduced to resonate out the leakage inductance and create a tuned or narrow band transformer. By combining the series capacitors between each adjacent transformer (two in series) and with DC biasing, only four capacitors Cin1, Cin2, Cin3 and Cin4 are used on the primaries for a power combiner with eight transformers instead of eight capacitors. Second, the tuned or narrow band transformer creates another opportunity on the transformer based power combiner where a single power amplifier and power combiner may be used to cover multiple frequencies by adjusting the capacitances of Cin1, Cin2, Cin3 and Cin4 on the primaries and Cout on the secondary. This may save silicon area, and may be used to support multiple transmitter bands. The RF inputs namely RFINP(0°), RFINN(0°) for the first amplifier and RFINP(90°), RFINN(90°) for the second amplifier are in differential (or complementary digital levels) as shown. These inputs are square wave, but may also be sine wave or others depend on how those transistors are being operated.

The components may be either partially or fully integrated on a single chip, which depends on the power level, cost, performance, and etc. For example, all the transformers may be printed on the package substrate in a flip-chip technology to lower the combiner's loss. Inductors L1, L2 and L3 (L3 may not be necessary, which depends on applications and cost) may be external components. Due to high voltage at POUT, capacitors Cout and Coutp may not be integrated. The outputs RFOUT(0°) and RFOUT(90°) are connected to the combiner.

Figure 5:
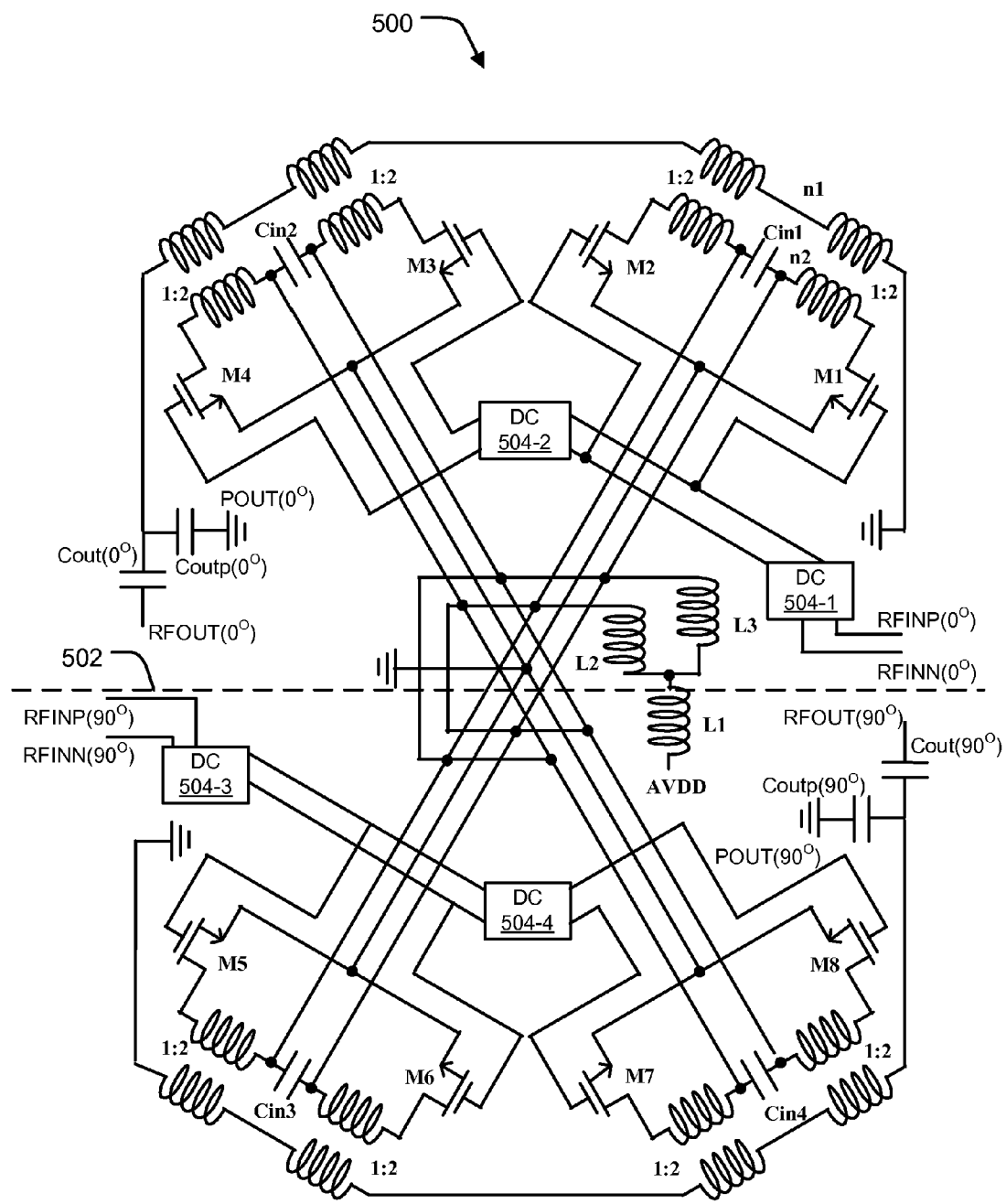
FIG. 5 illustrates an alternate implementation of a balanced power amplifier as a μ (micro) power amplifier and narrow band power combiner.

FIG. 5 shows another embodiment a power amplifier 500 of the balanced power amplifier shown in FIG. 3. Amplifier A 302 may be realized by the schematic above dotted line 502, and Amplifier B 304 may be implemented by the schematic below dotted line 502. In contrast to FIG. 4, the input and output positions of power amplifier 500 are swapped with power amplifier 400. This allows to obtain phase reversal, which might be preferable in certain configurations.

Figure 6:
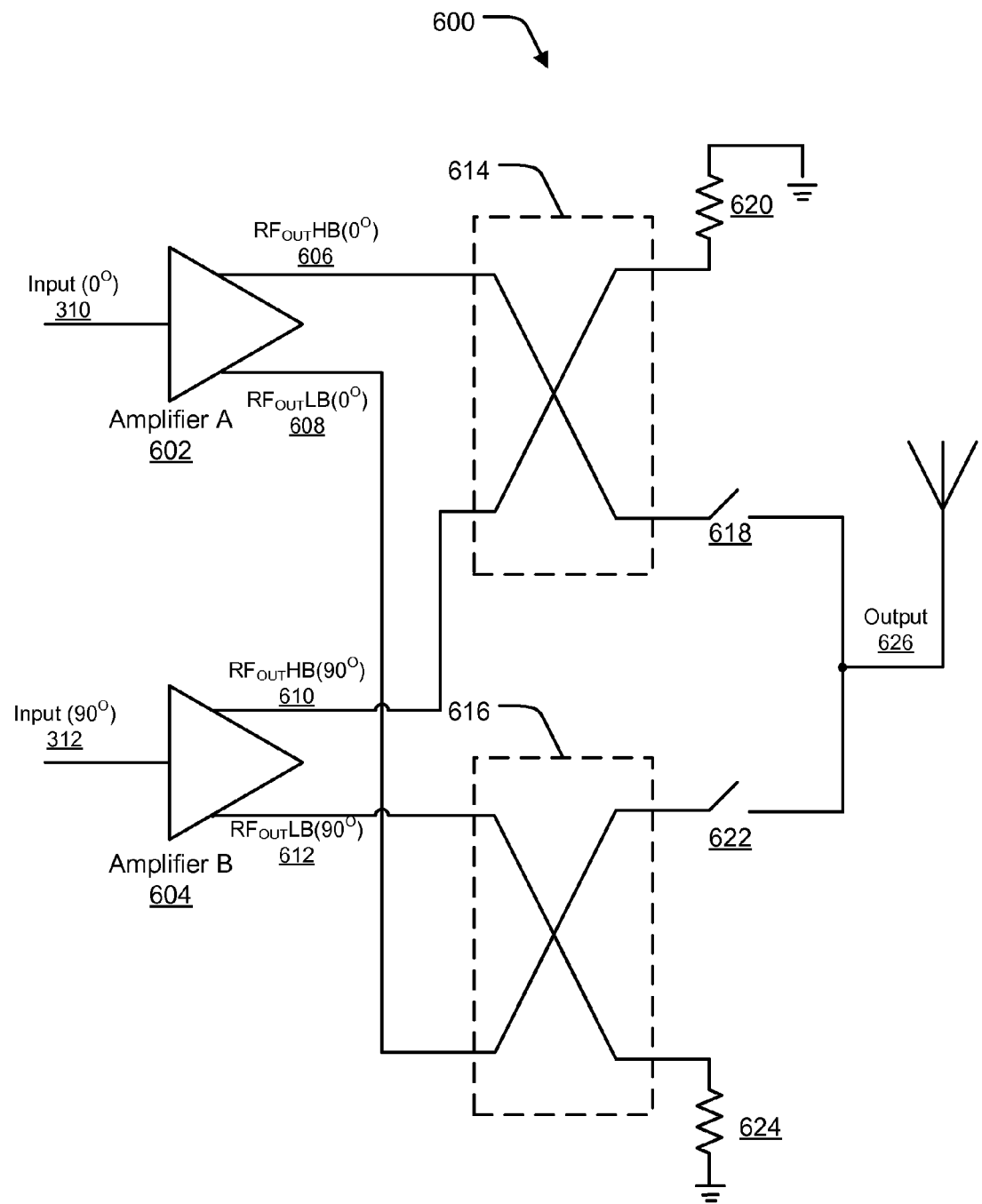
FIG. 6 illustrates a balanced amplifier to cover dual-band with RF switches and an antenna output.

FIG. 6 shows a power amplifier 600 to support high frequency band and low frequency band. Similarly to FIG. 3, two amplifiers Amplifier A 602 and Amplifier B 604 are implemented. Amplifier A 602 outputs RFoutHB(0°) 606 and RFoutLB(0°) 608, and Amplifier B outputs RFoutHB(90°) 610 and RFoutLB(90°) 612. Two hybrid frequency dependent couplers 614 and 616 may be used. RF switches 618 and 620 are used to select or connect to high or low band (frequency) outputs. In this implementation, resistors 620 and 624, which may be 50 ohm resistors are used.

Figure 7:
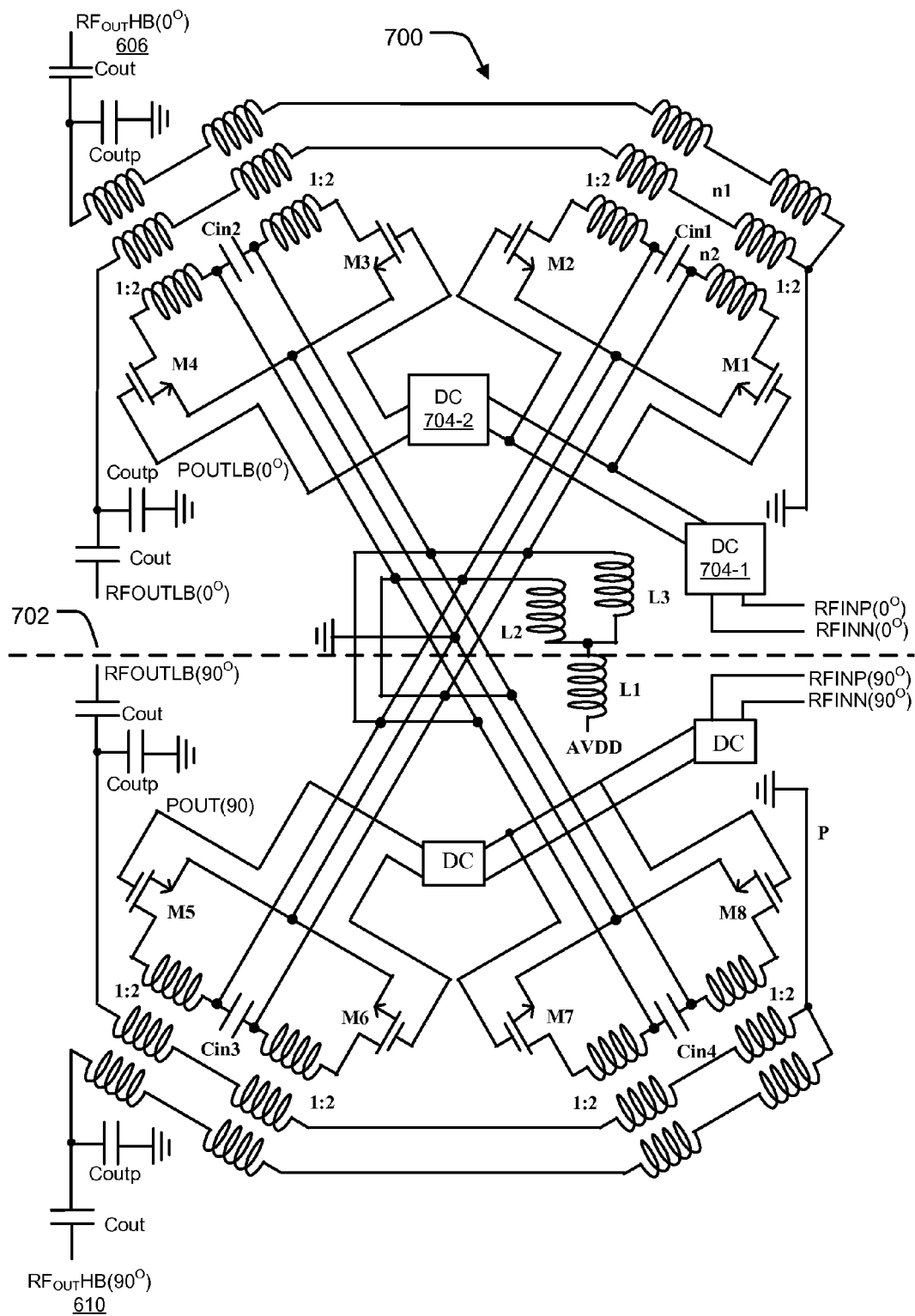
FIG. 7 illustrates an implementation of power amplifier as a μ (micro) power amplifier and narrow band power combiner that addresses dual-band.

FIG. 7 shows a balanced amplifier 700 that uses two amplifiers to cover two frequency bands as shown in FIG. 6. Amplifier 700 is similar to amplifier 400, with the addition of secondary paths and four more capacitors. The operation of using two amplifiers in a balanced amplifier to cover two frequency bands is as follow. For high frequency band operation, the capacitances at the primaries of the transformers namely Cin1, Cin2, Cin3 and Cin4 are tuned to the operating frequency and the RF switch at the high frequency band is closed and thus the balanced amplifier is transmitting the RF power at high frequency band to the antenna. Similarly, for low frequency band operation, the capacitances at the primaries of the transformers namely Cin1, Cin2, Cin3 and Cin4 are tuned to the operating frequency and the RF switch at the low frequency band is closed and thus the balanced amplifier is transmitting the RF power at low frequency band to the antenna. This concept may be extended to multiple frequency bands, and in certain implementations RF switches (i.e., switches 618 and 622) are not used, connecting directly the antenna to a high band coupler and low band coupler output.

Figure 8:
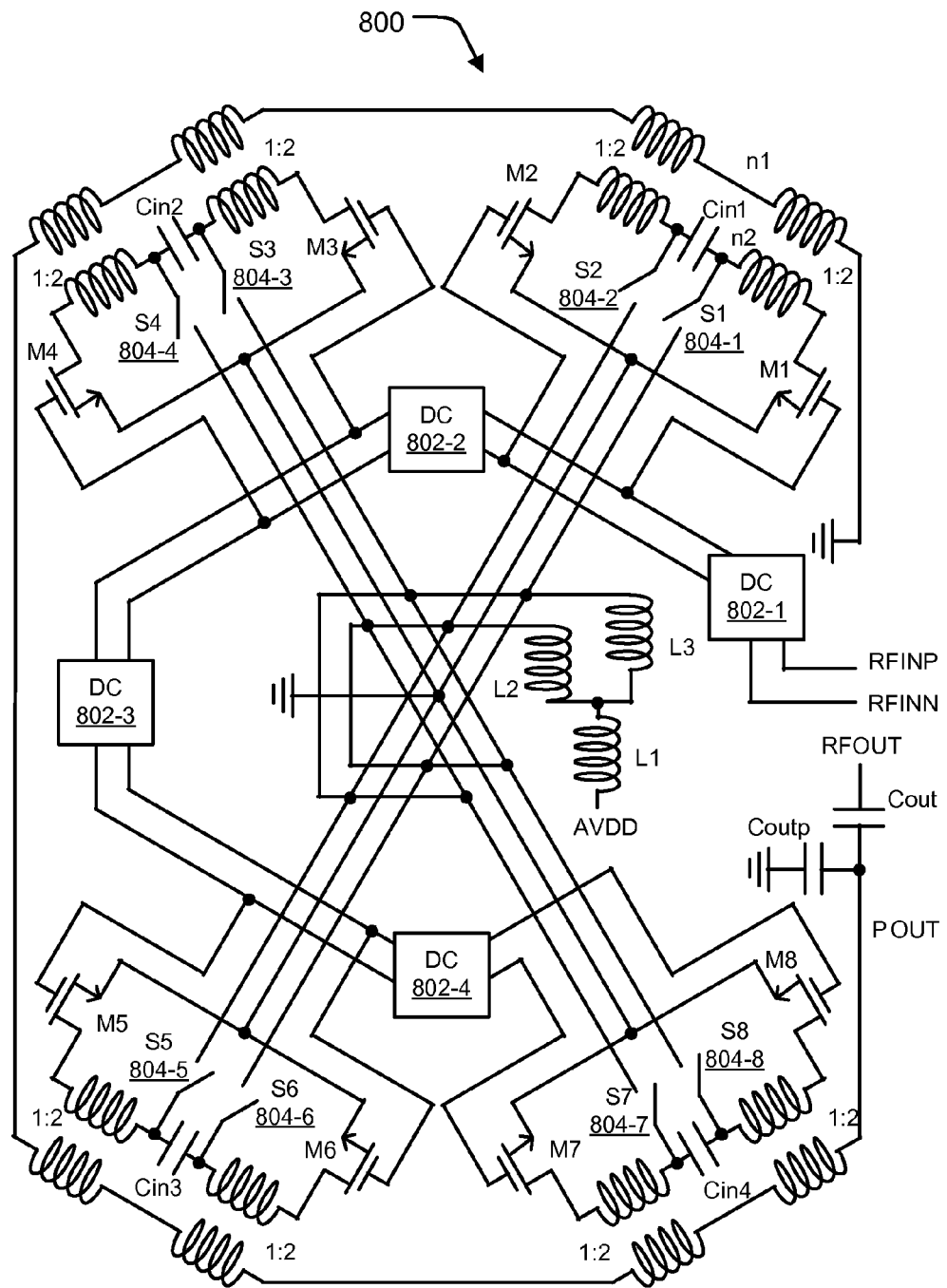
FIG. 8 illustrates an implementation of an amplifier as a μ (micro) power amplifier and narrow band power combiner that provides power control by switches.

FIG. 8 shows an exemplary schematic of a power amplifier 800 that implements power control. Power amplifier 800 further makes use of delay circuits or cells 802, as discussed above. Power control is an important feature in RF power amplifier design. In certain applications, for example in a GSM transmitter, the power amplifier may have to ramp output power within certain time period with a certain step size. Power control is also important for applications where the transmitter is not always transmitting at peak power, such as in a WCDMA transmitter, to accommodate more users in a given area.

Power control may be achieved by turning on and off a portion of the power combiner and the associated µPA as schematically shown in FIG. 8 with additional of eight switches namely S1 804-1, S2 804-2, S3 804-3, S4 804-4, S5 804-5, S6 804-6, S7 804-7, and S8 804-8.

When all the switches 804 are on, the CMOS power amplifier 800 may be transmitting at maximum power. To slightly reduce the transmitted output power for example, switch S1 804-1 is open and transistor M1 is turned off. An optional switch may be added in node n2 to pull this node to ground. Therefore, node n2 is grounded. Node n1 is ac-grounded. The output load is presented to seven of the transformers instead of eight at the maximum power and hence transistors M2, M3, M4, M5, M6, M7 and M8 see a higher load. If the active µPAs are transmitting with a constant output power with different loads, by manipulating the size of the µPA for example, the transmitted output power is reduced. For example, assume that the output power that each of the µPA may delivered is according to Equation 1 below (µPA is voltage limited):

$$P_{\mu PA} = V^2/2r \qquad \text{Equation 1}$$

where V is the peak voltage and r is the load resistance the µPA sees, Therefore, for N number of transformer with turn ratio of 1:2 as shown in FIG. 8, the total output power with power control delivered to output load of R assuming ideal power combiner may be expressed as Equation 2:

$$P_{total} = 2V^2 N^2/R \qquad \text{Equation 2}$$

For a transformer having turn ratio of 1:1, the total output power with power control delivered to output load of R assuming ideal power combiner is defined by Equation 3:

$$P_{total} = 2V^2 N^2/2R \qquad \text{Equation 3}$$

Figure 9:
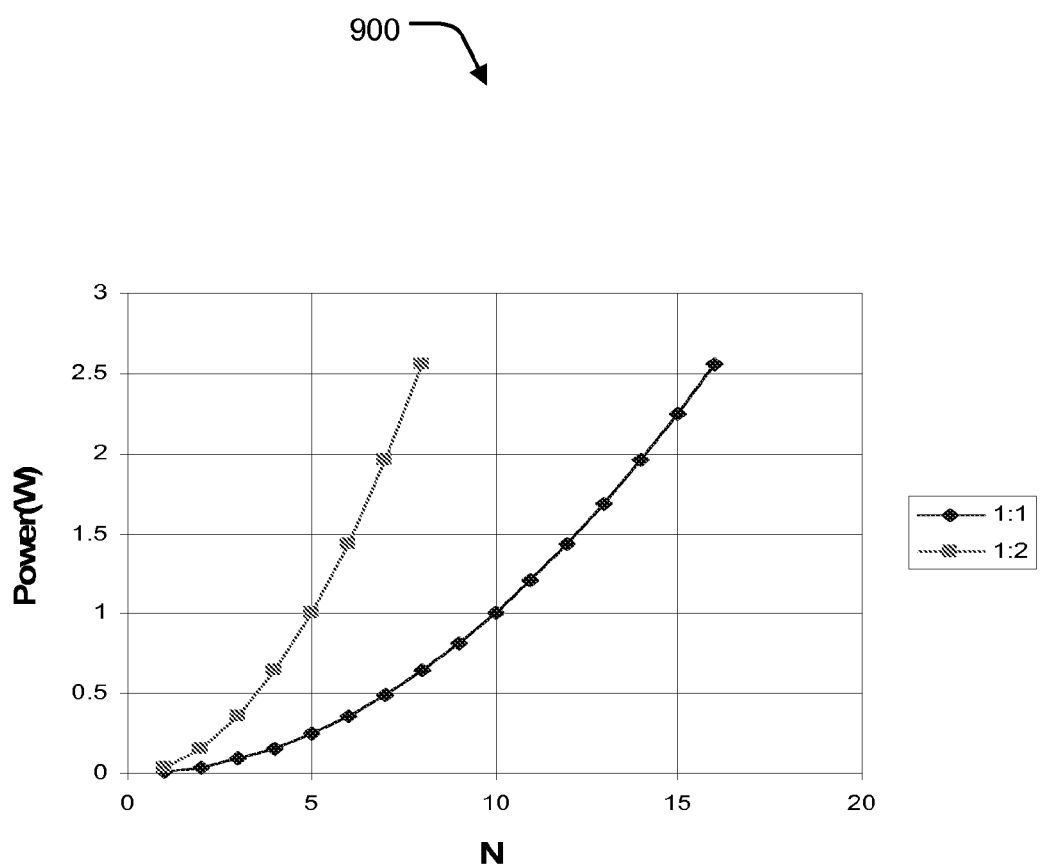
FIG. 9 illustrates output power of a power amplifier with power control versus the number of active stages.

The output power versus N for transformer having turn ratio of 1:1 and 1:2 is shown in FIG. 9. An option to control the output power is to turn off and on portion by portion of the µPA. For example, each µPA may include 1000 individual transistors. By tuning off and on some of transistors, the output power may be controlled accordingly.

Figure 10:
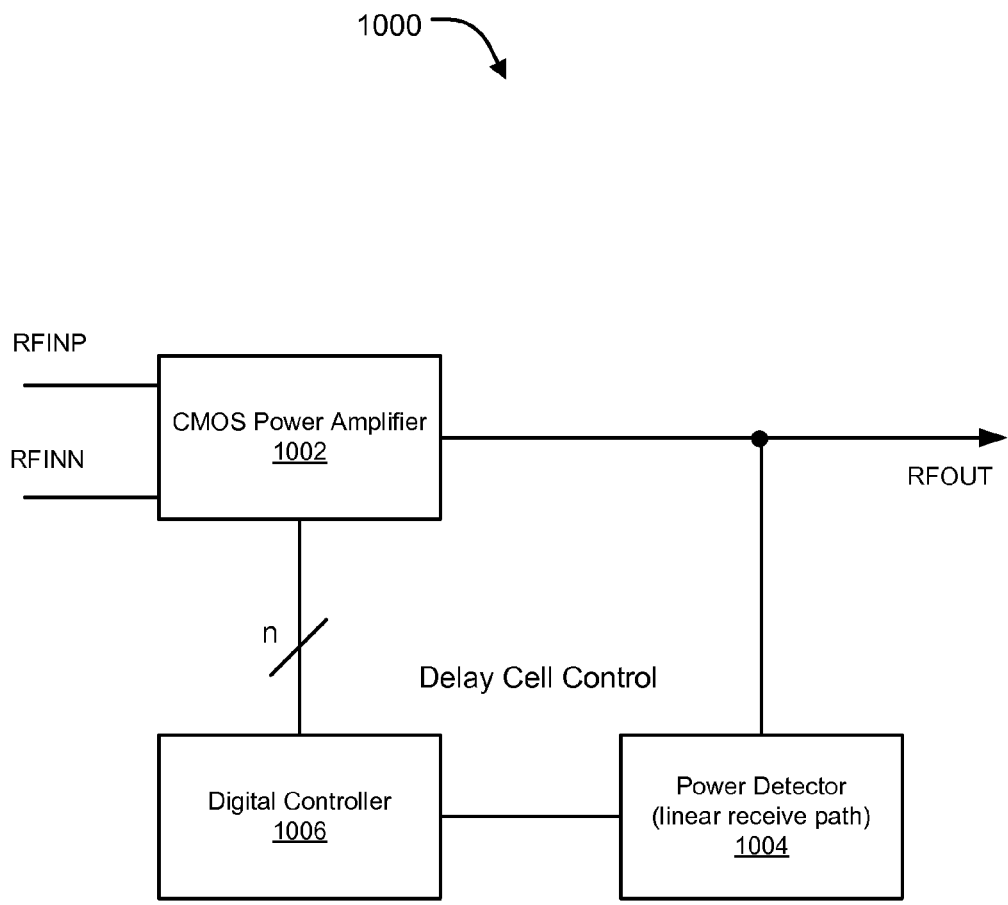
FIG. 10 illustrates auto calibration of delay cell to maximize transmitted power output.

As discussed, delay cells may be used to maximize the delivered output power or to assure that the output from each of the transformer's outputs are combined in phase. FIG. 10 shows a block diagram 1000 to automate the process. A power amplifier 1002 has an RFOUT that is detected by a power detector or a linear receive path 1004. The output from the power detector or receive path 1004 is sent to a digital controller 1006. The digital controller 1006 may adjust each of the delay to the power amplifier 1002 accordingly, in way to maximize the output power at the RFOUT. If the delay cells are cascaded, then the cell delay control may preferably start from the first cell, i.e., the closest to the input.

Figure 11A:
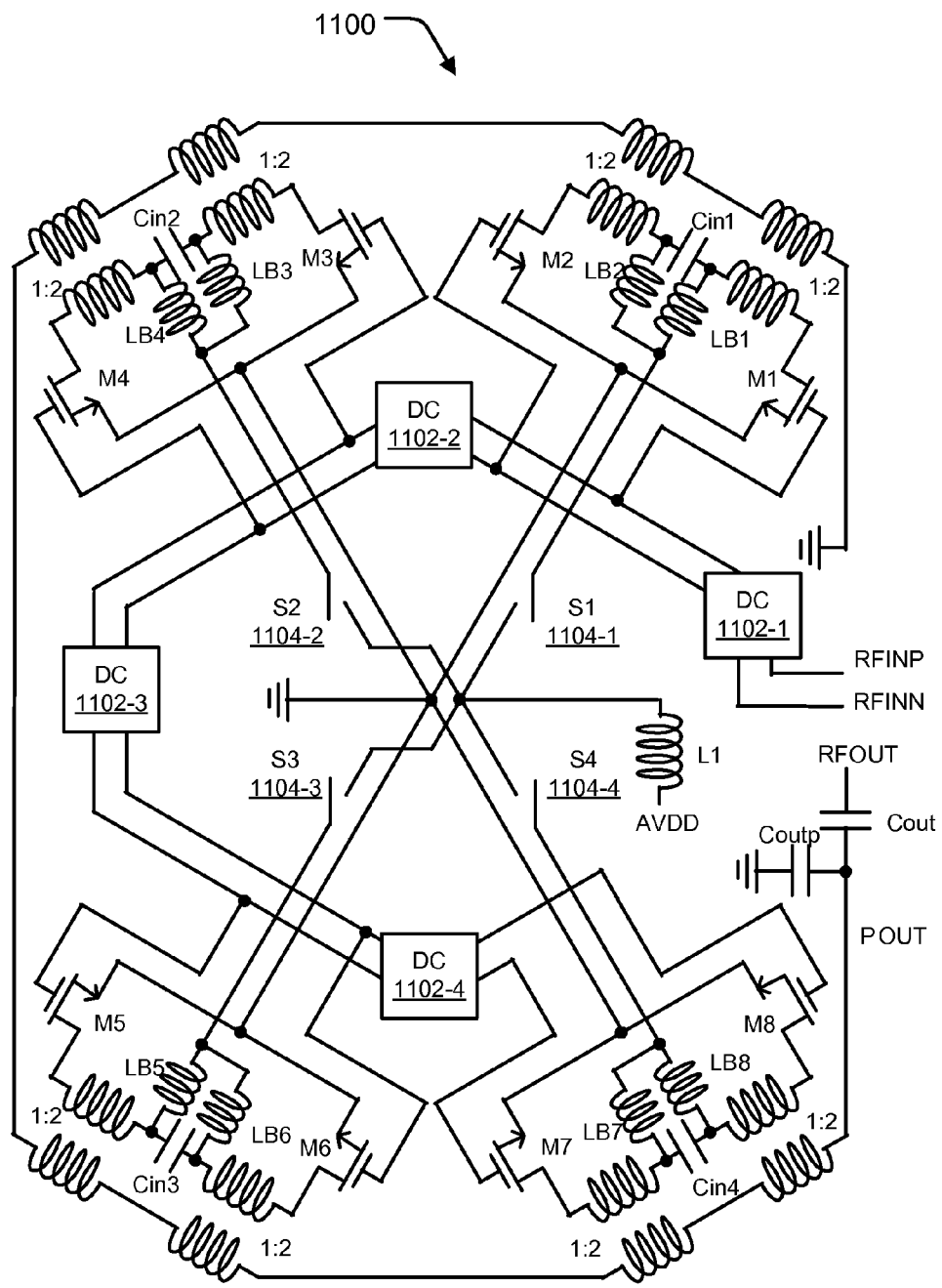
FIG. 11A illustrates an alternate implementation of an amplifier as a μ (micro) power amplifier and narrow band power combiner that provides power control by switches.

FIG. 11A shows an exemplary schematic of a power amplifier 1100 that implements power control. Power amplifier 1100 includes delay cells 1102 and switches 1106. Power amplifier 1100 provides for finer output power step change, and implements addition sections and transformers as compared to power amplifier 800. In this implementation, transistor pair granularity is addressed versus individual transistor granularity.

Figure 11B:
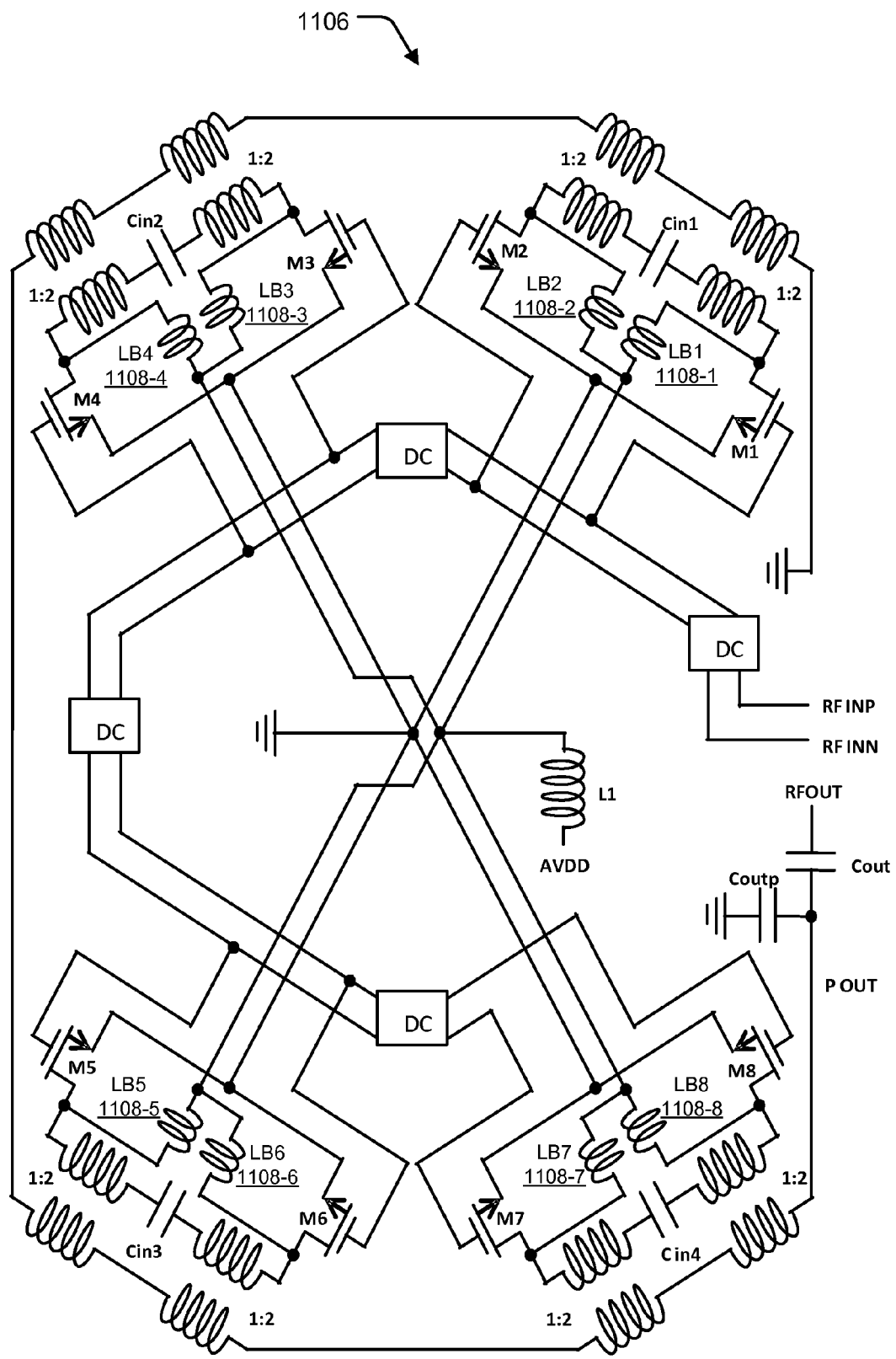
FIG. 11B illustrates an alternate implementation of a balanced amplifier as a μ (micro) power amplifier with VDD connected to transistor drains.

FIG. 11B shows an exemplary schematic of a power amplifier 1106. In particular, power amplifier 1106 is an alternate embodiment a power amplifier 1100 where VDD is connected to drains. In this embodiment, dc bias inductors LB1 1108-1, LB2 1108-2, LB3 1108-3, LB4 1108-4, LB5 1108-5, LB6 1108-6, LB7 1108-7, and LB8 1108-8 are connected to the transistor drains.

Figure 11C:
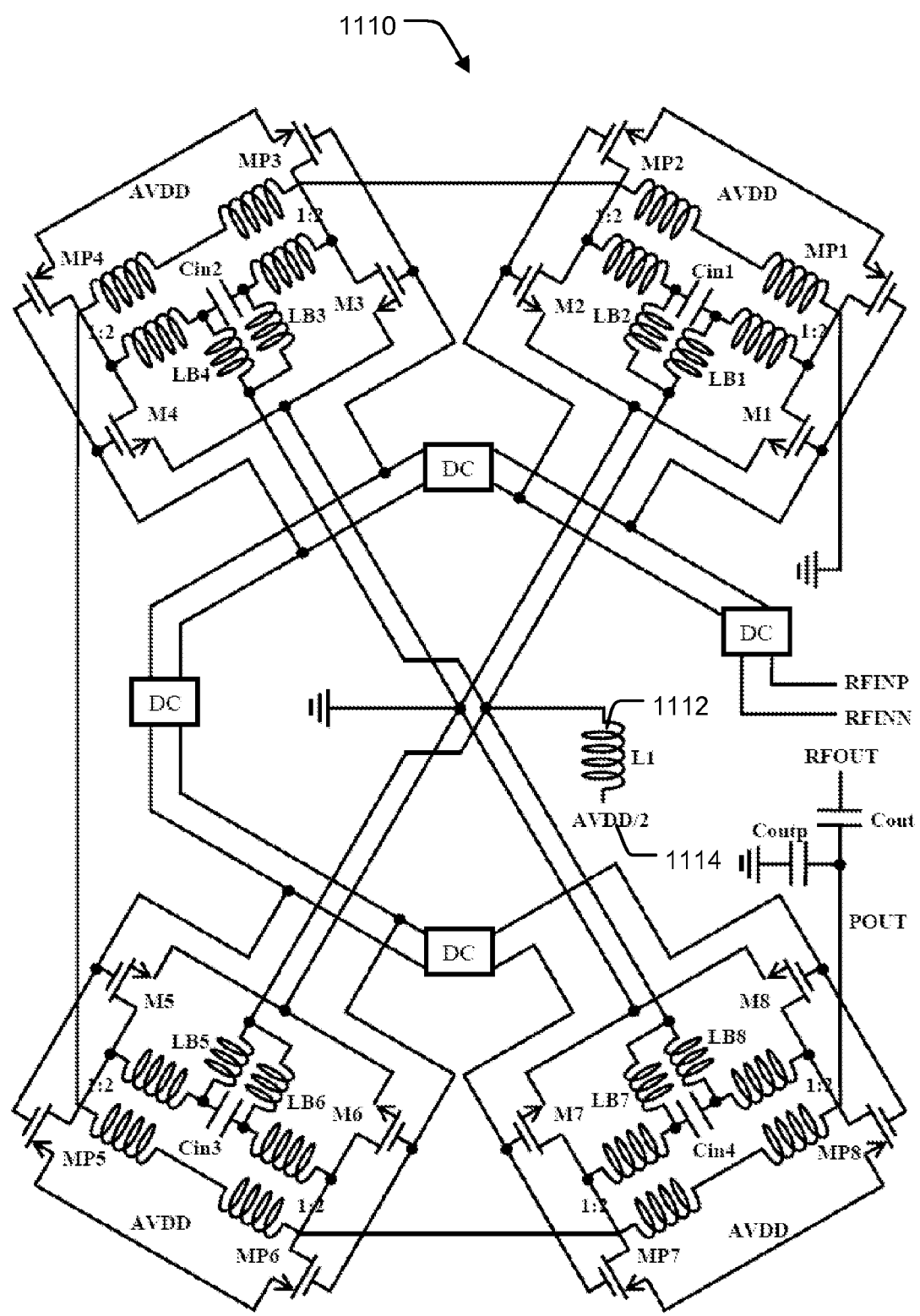
FIG. 11C illustrates an alternate implementation of a balanced amplifier as a μ (micro) power amplifier in "push-pull".

FIG. 11C shows an exemplary schematic of a power amplifier 1110. In particular, power amplifier 1110 is an implementation in "push-pull" and may operate in a switching mode operation. In this example, NMOS transistors are implemented, where dc bias at one end of inductor LI 1112 is changed to half of the power supply namely AVDD/2 1114. By arranging the transistors in this way, the output swing at the drains of the NMOS and PMOS transistors are restricted to the maximum of AVDD and helps to reduce the stress on those transistors.

Figure 12:
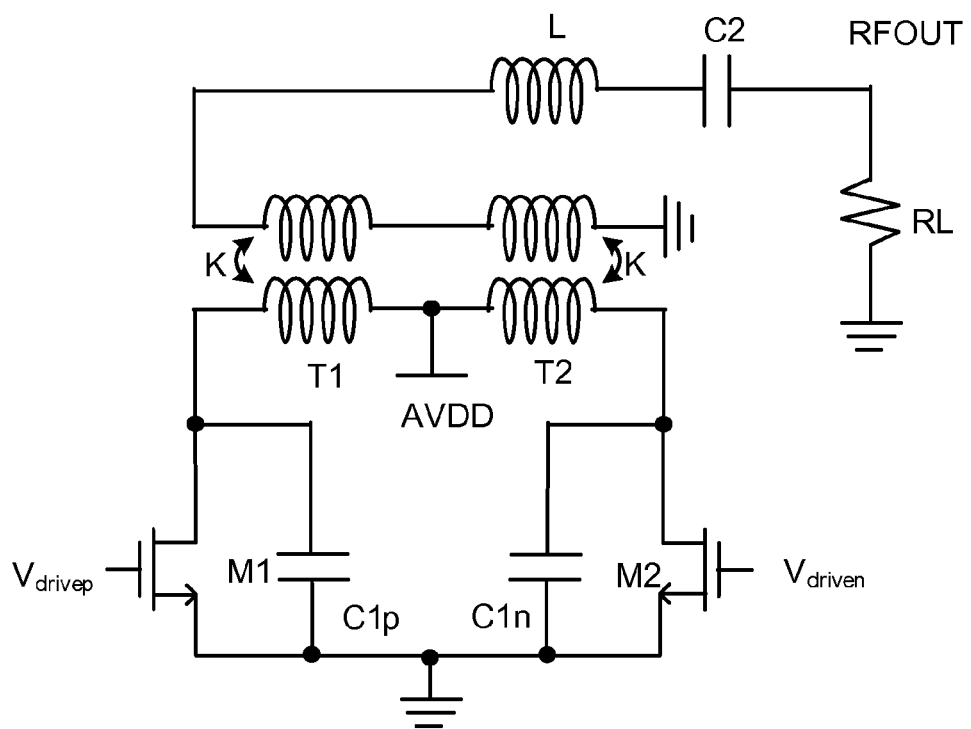
FIG. 12 illustrates a fully differential class E power amplifier with transformers.

In certain digital amplifiers, where a transistor operates as a digital switch, issues may arise in matching inductor, capacitor and resistor components. FIG. 12 shows an exemplary class E differential power amplifier 1200. Power amplifier includes capacitors C1p and C1n, and inductor L, and capacitor C2 in series with the secondaries of transformers T1 and T2. In this implementation only one matching network of L and C2 are needed to support two stages operating in a pseudo differential manner, meaning that if one of the transistors M1 or M2 is currently on, the other is off. The outputs of M1 and M2 with the secondary windings are combined such that the outputs are added, having only one matching network for the two transistors M1 and M2.

Figure 13:
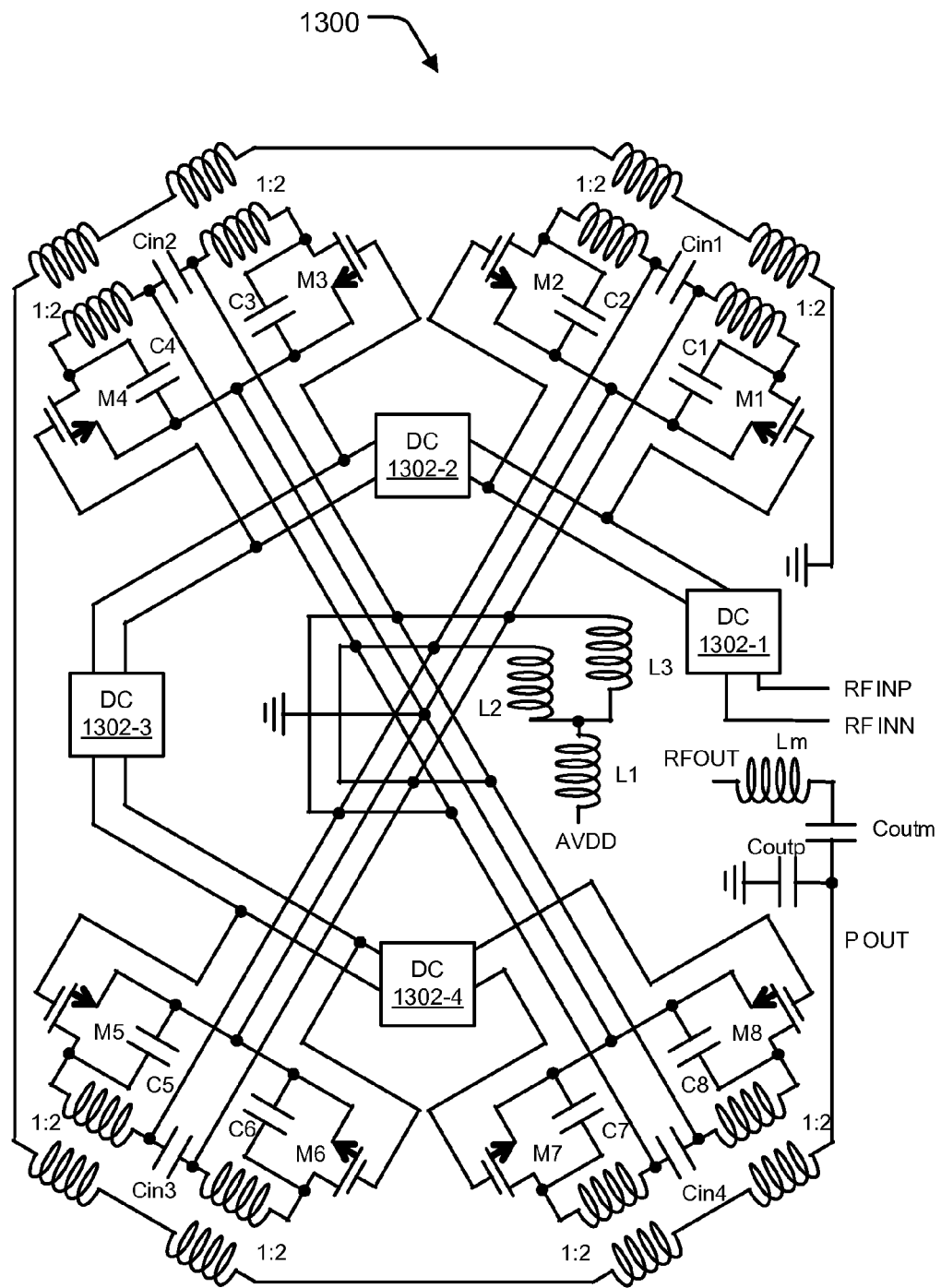
FIG. 13 illustrates an implementation of a fully differential class E power amplifier as a μ (micro) power amplifier and narrow band power combiner that provides power control by switches.

FIG. 13 shows an exemplary schematic of a fully integrated fully differential power amplifier 1300 that implements power control with power combining. In this implementation, one matching network supports four stages. Capacitors C1, C2, C3, C4, C5, C6, C7 and C8 are included in primary windings to function as capacitor in a typical class E power amplifier, Lm and Coutm function as inductor (L) and capacitor (C) in a typical class E power amplifier.

The power amplifier 1300 is assumed to be driven with rail-to-rail input to achieve as high efficiency as possible. Since the capacitances of C1, C2, C3, C4, C5, C6, C7 and C8 on the primaries and Coutm (Coutp also) and Lm on the secondaries depend on the operating frequency, in order to cover multi-bands, the capacitances of C1, C2, C3, C4, C5, C6, C7 and C8 are programmable and multi secondaries with unique value of Coutm and Lm. There are a few ways to make capacitor C1, C2, C3, C4, C5, C6, C7 and C8 programmable, where one method is to add series transistors with those capacitors and by turning on and off those switches, and the capacitances may be changed accordingly.

Figure 14:
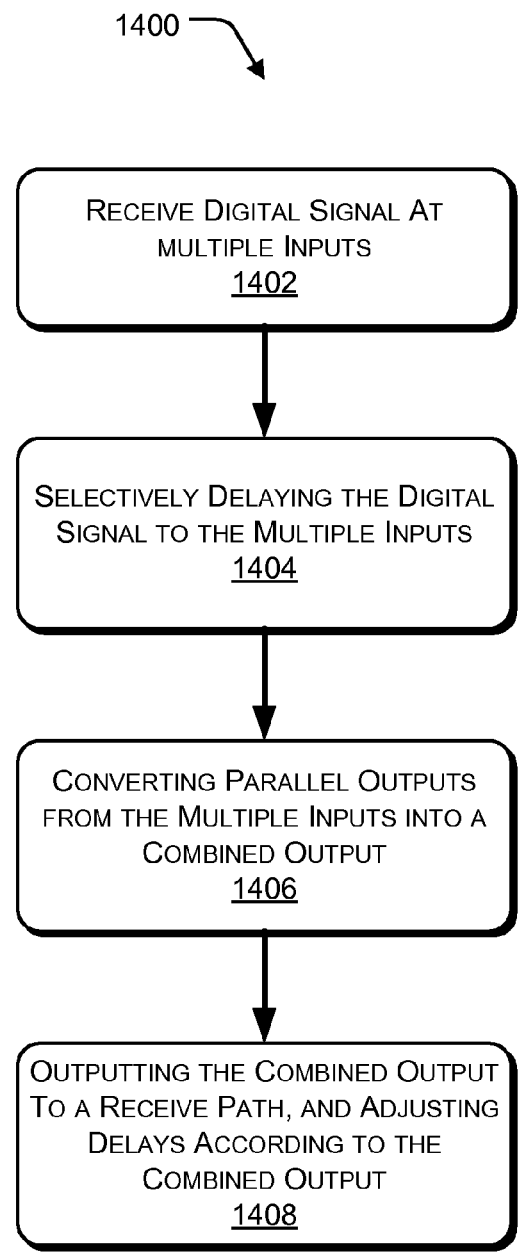
FIG. 14 is a flowchart illustrating power control in digital power amplifiers.

FIG. 14 is a flowchart 1400 that shows power control of digital power amplifiers. The flowchart may be particularly implemented by the architectures described above; however, it is to be appreciated that other architectures may implement the blocks described in flowchart 1400.

At block 1402, multiple digital signals are received. The digital signals may be received by an array of parallel digitally controlled power amplifiers as described above. A digital control source may provide the digital signals, where the digital signals may include clock signals.

At block 1404, selective delays are provided to the digital input signals. The selective delays may be clock delays, and may depend on location of the power amplifiers. The delays may be implemented for compensation in power output of the array of power amplifiers. As discussed above, the delays may be used to squelch a clock and effectively shut down one or more of the power amplifiers. Furthermore, shutting down power amplifiers may reduce RF leakage and increases the dynamic range.

At block 1406, the parallel outputs from the multiple inputs are converted to a combined output. Individual outputs of each of the power amplifiers in the array maybe received by distributed transformer that converts the outputs of the power amplifiers to a single combined output.

At block 1408, the combined output is sent (outputted). For example, the output may be to transmit and receive switch. In certain implementations, the serial output may be used to adjust or readjust the delays.

CONCLUSION

The above-described systems, devices, and methods describe providing power control in digital power amplifiers. Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. A system comprising:
   an array of digitally controlled power amplifiers;
   a combination transformer that receives outputs of the power amplifiers; and
   digital control of delay cells placed before the power amplifiers, that affect digital inputs to the power amplifiers.

2. The system of claim 1, wherein the array of digitally controlled power amplifiers include fully integrated balanced amplifiers with digital clock carrier inputs.

3. A system comprising:
   an array of digitally controlled power amplifiers;
   a combination transformer that receives outputs of the power amplifiers;
   digital control of delay cells placed before the power amplifiers, that affect digital inputs to the power amplifiers;
   the array of digitally controlled power amplifiers include fully integrated balanced amplifiers with digital clock carrier inputs; and
   the fully integrated balanced amplifiers include a hybrid coupler to adjust for phase shift.

4. The system of claim 1, wherein the array of digitally controlled power amplifiers is implemented with a narrow band power combiner.

5. The system of claim 4, wherein a portion of the array of digitally controlled power amplifiers and the narrow band power combiner may be turned on and off.

6. A system comprising:
   an array of digitally controlled power amplifiers;
   a combination transformer that receives outputs of the power amplifiers;
   digital control of delay cells placed before the power amplifiers, that affect digital inputs to the power amplifiers; and
   the array of digitally controlled power amplifiers includes power amplifiers that support a high frequency band and a low frequency band.

7. A system comprising:
   an array of digitally controlled power amplifiers;
   a combination transformer that receives outputs of the power amplifiers;
   digital control of delay cells placed before the power amplifiers, that affect digital inputs to the power amplifiers;
   wherein the array of digitally controlled power amplifiers includes two power amplifiers that support a high frequency band and a low frequency band; and
   the two power amplifiers cover two bands.

8. The system of claim 1, wherein the array of digitally controlled power amplifiers includes power amplifiers having adjustable transistor pairs.

9. A system comprising:
   an array of digitally controlled power amplifiers;
   a combination transformer that receives outputs of the power amplifiers;
   digital control of delay cells placed before the power amplifiers, that affect digital inputs to the power amplifiers; and the array of digitally controlled power amplifiers includes power amplifiers having drains connected to a power supply through an inductor.

10. The system of claim 1, wherein the array of digitally controlled power amplifiers includes power amplifiers that operate in a switching mode operation.

11. The system of claim 1, wherein the combination transformer is a distributed transformer.

12. The system of claim 1, wherein the delay cells squelch a clock signal to shut down one or more of the power amplifiers.

13. A system comprising:
an array of digitally controlled power amplifiers;
a combination transformer that receives outputs of the power amplifiers;
digital control of delay cells placed before the power amplifiers, that affect digital inputs to the power amplifiers; and
the delay cells include transistors that are switched on or off, and have adjustable capacitance.

14. The system of claim 1 further comprising a digital control source that provides the inputs to the power amplifiers.

15. A digitally controlled power amplifier comprising:
an input clock;
an array of delay elements coupled to the input clock;
an array of controllable groups of switches coupled to said array of delay elements; and
a distributed transformer coupled to the array of controllable groups of switches.

16. The digitally controlled power amplifier of claim 15, wherein adjusting said array of controllable groups of switches changes delay of the delay elements.

17. The digitally controlled power amplifier of claim 15, wherein adjusting said array of controllable groups of switches is performed to maximize output power of the digitally controlled power amplifier.

18. The digitally controlled power amplifier of claim 15 further comprising a matching network coupled to the distributed transformer.

19. A method for power control of digital power amplifiers comprising:
receiving multiple digital signals;
digitally controlling the delay of selective digital signals of the multiple digital signals;
converting parallel outputs of the digital signals to a combined output; and
outputting the combined output.

20. The method of claim 19, wherein digital signals are digital control clock signals.

21. The method of claim 19, wherein the receiving multiple digital signals are of digital control clock signals.

22. The method of claim 19, wherein the delaying is used to shut down one or more of the digital power amplifiers.

23. The method of claim 19, wherein the outputting the combined output is used to adjust the delaying.

* * * * *